(12) United States Patent
Pattanayak

(10) Patent No.: US 9,882,044 B2
(45) Date of Patent: Jan. 30, 2018

(54) EDGE TERMINATION FOR SUPER-JUNCTION MOSFETS

(71) Applicant: Vishay-Siliconix, Santa Clara, CA (US)

(72) Inventor: Deva Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/830,277

(22) Filed: Aug. 19, 2015

(65) Prior Publication Data

US 2016/0056281 A1 Feb. 25, 2016

Related U.S. Application Data

(60) Provisional application No. 62/039,346, filed on Aug. 19, 2014.

(51) Int. Cl.
| | | |
|---|---|---|
| H01L 29/78 | (2006.01) | |
| H01L 29/06 | (2006.01) | |
| H01L 29/10 | (2006.01) | |
| H01L 29/40 | (2006.01) | |

(52) U.S. Cl.
CPC ...... *H01L 29/7811* (2013.01); *H01L 29/0634* (2013.01); *H01L 29/0692* (2013.01); *H01L 29/1095* (2013.01); *H01L 29/7802* (2013.01); *H01L 29/7813* (2013.01); *H01L 29/407* (2013.01)

(58) Field of Classification Search
CPC ............ H01L 29/7811; H01L 29/7813; H01L 29/1095; H01L 29/404; H01L 29/0692; H01L 29/0634
USPC ................................. 257/330, 329
See application file for complete search history.

(56) References Cited

U.S. PATENT DOCUMENTS

| | | |
|---|---|---|
| 3,906,540 A | 9/1975 | Hollins |
| 4,191,603 A | 3/1980 | Garbarino et al. |
| 4,375,999 A | 3/1983 | Nawata et al. |
| 4,399,449 A | 8/1983 | Herman et al. |

(Continued)

FOREIGN PATENT DOCUMENTS

| | | |
|---|---|---|
| CN | 101180737 | 5/2008 |
| CN | 102194701 | 9/2011 |

(Continued)

OTHER PUBLICATIONS

"SMID60N06, 60N05, SMP50N06, 50N05, N-Channel Enhancement Mode Transistors," MOSPOWER Data Book, Siliconix inc., 1988, pp. 4-423-4-426.

(Continued)

*Primary Examiner* — Yasser A Abdelaziez

(57) ABSTRACT

Edge termination for super-junction MOSFETs. In accordance with an embodiment of the present invention, a super-junction metal oxide semiconductor field effect transistor (MOSFET) includes a core super-junction region including a plurality of parallel core plates coupled to a source terminal of the super-junction MOSFET. The super-junction MOSFET also includes a termination region surrounding the core super-junction region comprising a plurality of separated floating termination segments configured to force breakdown into the core super-junction region and not in the termination region. Each termination segment has a length dimension less than a length dimension of the core plates.

6 Claims, 4 Drawing Sheets

(56) References Cited

U.S. PATENT DOCUMENTS

| | | |
|---|---|---|
| 4,532,534 A | 7/1985 | Ford et al. |
| 4,584,025 A | 4/1986 | Takaoka et al. |
| 4,593,302 A | 6/1986 | Lidow et al. |
| 4,602,266 A | 7/1986 | Coe |
| 4,620,211 A | 10/1986 | Baliga et al. |
| 4,641,174 A | 2/1987 | Baliga |
| 4,646,117 A | 2/1987 | Temple |
| 4,672,407 A | 6/1987 | Nakagawa et al. |
| 4,680,853 A | 7/1987 | Lidow et al. |
| 4,710,265 A | 12/1987 | Hotta |
| 4,782,372 A | 11/1988 | Nakagawa et al. |
| 4,799,095 A | 1/1989 | Baliga |
| 4,803,532 A | 2/1989 | Mihara |
| 4,819,044 A | 4/1989 | Murakami |
| 4,819,052 A | 4/1989 | Hutter |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,941,026 A | 7/1990 | Temple |
| 4,954,854 A | 9/1990 | Dhong et al. |
| 4,967,243 A | 10/1990 | Baliga et al. |
| 4,969,027 A | 11/1990 | Baliga et al. |
| 4,974,059 A | 11/1990 | Kinzer |
| 4,982,249 A | 1/1991 | Kim et al. |
| 5,016,066 A | 5/1991 | Takahashi |
| 5,019,526 A | 5/1991 | Yamane et al. |
| 5,021,840 A | 6/1991 | Morris |
| 5,034,338 A | 7/1991 | Neppl et al. |
| 5,034,346 A | 7/1991 | Alter et al. |
| 5,055,896 A | 10/1991 | Williams et al. |
| 5,072,266 A | 12/1991 | Bulucea et al. |
| 5,086,007 A | 2/1992 | Ueno |
| 5,087,577 A | 2/1992 | Strack |
| 5,111,253 A | 5/1992 | Korman et al. |
| 5,113,237 A | 5/1992 | Stengl |
| 5,156,993 A | 10/1992 | Su |
| 5,160,491 A | 11/1992 | Mori |
| 5,168,331 A | 12/1992 | Yilmaz |
| 5,171,699 A | 12/1992 | Hutter et al. |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,250,449 A | 10/1993 | Kuroyanagi et al. |
| 5,268,586 A | 12/1993 | Mukherjee et al. |
| 5,298,442 A | 3/1994 | Bulucea et al. |
| 5,316,959 A | 5/1994 | Kwan et al. |
| 5,341,011 A | 8/1994 | Hshieh et al. |
| 5,362,665 A | 11/1994 | Lu |
| 5,366,914 A | 11/1994 | Takahashi et al. |
| 5,378,655 A | 1/1995 | Hutchings et al. |
| 5,387,528 A | 2/1995 | Hutchings et al. |
| 5,396,085 A | 3/1995 | Baliga |
| 5,404,040 A | 4/1995 | Hshieh et al. |
| 5,422,508 A | 6/1995 | Yilmaz et al. |
| 5,429,964 A | 7/1995 | Yilmaz et al. |
| 5,430,315 A | 7/1995 | Rumennik |
| 5,497,013 A | 3/1996 | Temple |
| 5,521,409 A | 5/1996 | Hshieh et al. |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,597,765 A | 1/1997 | Yilmaz et al. |
| 5,602,424 A | 2/1997 | Tsubouchi et al. |
| 5,614,751 A | 3/1997 | Yilmaz et al. |
| 5,621,234 A | 4/1997 | Kato |
| 5,648,283 A | 7/1997 | Tsang et al. |
| 5,689,128 A | 11/1997 | Hshieh et al. |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,228,700 B1 | 5/2001 | Lee |
| 6,238,981 B1 | 5/2001 | Grebs |
| 6,245,615 B1 | 6/2001 | Noble et al. |
| 6,268,242 B1 | 7/2001 | Williams et al. |
| 6,274,904 B1 | 8/2001 | Tihanyi |
| 6,277,695 B1 | 8/2001 | Williams et al. |
| 6,285,060 B1 | 9/2001 | Korec et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,380,569 B1 | 4/2002 | Chang et al. |
| 6,391,721 B2 | 5/2002 | Nakagawa |
| 6,413,822 B2 | 7/2002 | Williams et al. |
| 6,465,843 B1 | 10/2002 | Hirler et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,620,691 B2 | 9/2003 | Hshieh et al. |
| 6,621,122 B2 | 9/2003 | Qu |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,794,239 B2 | 9/2004 | Gonzalez |
| 6,825,105 B2 | 11/2004 | Grover et al. |
| 6,831,345 B2 | 12/2004 | Kinoshita et al. |
| 6,836,001 B2 | 12/2004 | Yamauchi et al. |
| 6,861,701 B2 | 3/2005 | Williams et al. |
| 6,903,393 B2 | 6/2005 | Ohmi et al. |
| 6,919,610 B2 | 7/2005 | Saitoh et al. |
| 6,927,451 B1 | 8/2005 | Darwish |
| 6,927,455 B2 | 8/2005 | Narazaki |
| 6,960,821 B2 | 11/2005 | Noble et al. |
| 6,987,305 B2 | 1/2006 | He et al. |
| 7,045,857 B2 | 5/2006 | Darwish et al. |
| 7,122,875 B2 | 10/2006 | Hatade |
| 7,161,209 B2 | 1/2007 | Saito et al. |
| 7,224,022 B2 | 5/2007 | Tokano et al. |
| 7,319,256 B1 | 1/2008 | Kraft et al. |
| 7,335,946 B1 | 2/2008 | Bhalla et al. |
| 7,348,235 B2 | 3/2008 | Fujiishi |
| 7,361,952 B2 | 4/2008 | Miura et al. |
| 7,375,029 B2 | 5/2008 | Poelzl |
| 7,397,083 B2 | 7/2008 | Amali et al. |
| 7,449,354 B2 | 11/2008 | Marchant et al. |
| 7,470,953 B2 | 12/2008 | Takaya et al. |
| 7,504,307 B2 | 3/2009 | Peake |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,601,603 B2 | 10/2009 | Yamauchi et al. |
| 7,642,178 B2 | 1/2010 | Yamauchi et al. |
| 7,659,588 B2 | 2/2010 | Husain et al. |
| 7,663,195 B2 | 2/2010 | Ohmi et al. |
| 7,700,970 B2 | 4/2010 | Saggio et al. |
| 7,704,864 B2 | 4/2010 | Hshieh |
| 7,745,883 B2 | 6/2010 | Williams et al. |

(56) References Cited

U.S. PATENT DOCUMENTS

| | | |
|---|---|---|
| RE41,509 E | 8/2010 | Kinzer et al. |
| 7,767,500 B2 | 8/2010 | Sridevan |
| 7,811,907 B2 | 10/2010 | Shibata et al. |
| 7,834,376 B2 | 11/2010 | Carta et al. |
| 7,910,440 B2 | 3/2011 | Ohta et al. |
| 7,910,486 B2 | 3/2011 | Yilmaz et al. |
| 7,911,020 B2 | 3/2011 | Niimura et al. |
| 7,964,913 B2 | 6/2011 | Darwish |
| 8,076,718 B2 | 12/2011 | Takaya et al. |
| 8,080,459 B2 | 12/2011 | Xu |
| 8,247,296 B2 | 8/2012 | Grivna |
| 8,334,566 B2 | 12/2012 | Tai |
| 8,367,500 B1 | 2/2013 | Xu et al. |
| 8,368,165 B2 | 2/2013 | Richieri |
| RE44,236 E | 5/2013 | Yamauchi et al. |
| 8,536,003 B2 | 9/2013 | Lin et al. |
| 8,536,004 B2 | 9/2013 | Lin et al. |
| 8,541,278 B2 | 9/2013 | Lin et al. |
| 8,541,834 B2 | 9/2013 | Nozu |
| 8,558,309 B2 | 10/2013 | Tamaki et al. |
| 8,564,088 B2 | 10/2013 | Schmidt |
| 8,575,707 B2 | 11/2013 | Tamaki et al. |
| 8,598,657 B2 | 12/2013 | Tamaki et al. |
| 8,603,879 B2 | 12/2013 | Lin et al. |
| 8,629,019 B2 | 1/2014 | Xu et al. |
| 8,633,561 B2 | 1/2014 | Husain et al. |
| 8,643,056 B2 | 2/2014 | Kimura et al. |
| 8,643,089 B2 | 2/2014 | Lee et al. |
| 8,669,614 B2 | 3/2014 | Cheng |
| 8,716,789 B2 | 5/2014 | Ono et al. |
| 8,748,973 B2 | 6/2014 | Lin et al. |
| 8,749,017 B2 | 6/2014 | Lu |
| 8,772,869 B2 | 7/2014 | Saito et al. |
| 8,786,046 B2 | 7/2014 | Tamaki et al. |
| 8,790,971 B1 | 7/2014 | Lin et al. |
| 8,796,787 B2 | 8/2014 | Tamaki et al. |
| 8,803,207 B2 | 8/2014 | Grebs et al. |
| 8,836,017 B2 | 9/2014 | Lee et al. |
| 8,847,305 B2 | 9/2014 | Toyoda et al. |
| 8,860,144 B2 | 10/2014 | Ohta et al. |
| 8,901,652 B2 | 12/2014 | Saggio et al. |
| 8,940,606 B2 | 1/2015 | Lin et al. |
| 8,963,260 B2 | 2/2015 | Lin et al. |
| 8,981,469 B2 | 3/2015 | Tamaki et al. |
| 8,987,819 B2 | 3/2015 | Tamaki et al. |
| 9,000,516 B2 | 4/2015 | Xiao |
| 9,006,822 B2 | 4/2015 | Peake et al. |
| 9,029,946 B2 | 5/2015 | Davies |
| 9,041,070 B2 | 5/2015 | Eguchi et al. |
| 9,041,101 B2 | 5/2015 | Ono et al. |
| 9,048,250 B2 | 6/2015 | Yamada et al. |
| 9,076,725 B2 | 7/2015 | Niimura |
| 9,076,887 B2 | 7/2015 | Lee et al. |
| 9,082,810 B2 | 7/2015 | Kitagawa |
| 9,093,288 B2 | 7/2015 | Tamaki et al. |
| 9,111,770 B2 | 8/2015 | Lin et al. |
| 9,129,892 B2 | 9/2015 | Toyoda et al. |
| 9,136,324 B2 | 9/2015 | Kimura et al. |
| 9,136,325 B2 | 9/2015 | Tan et al. |
| 9,166,036 B2 | 10/2015 | Tamaki |
| 9,177,866 B2 | 11/2015 | Davies |
| 9,236,460 B2 | 1/2016 | Koyama et al. |
| 9,240,464 B2 | 1/2016 | Eguchi et al. |
| 9,269,767 B2 | 2/2016 | Tamaki et al. |
| 9,281,393 B2 | 3/2016 | Ma et al. |
| 9,293,564 B2 | 3/2016 | Nishimura et al. |
| 9,306,064 B2 | 4/2016 | Wahl et al. |
| 9,312,332 B2 | 4/2016 | Lu |
| 9,349,721 B2 | 5/2016 | Saito et al. |
| 9,362,118 B2 | 6/2016 | Toyoda et al. |
| 9,362,393 B2 | 6/2016 | Sakata et al. |
| 9,368,617 B2 | 6/2016 | Hirler et al. |
| 9,379,235 B2 | 6/2016 | Tamaki et al. |
| 9,412,880 B2 | 8/2016 | Carta et al. |
| 9,419,092 B2 | 8/2016 | Carta et al. |
| 9,425,306 B2 | 8/2016 | Gao et al. |
| 9,431,249 B2 | 8/2016 | Pattanayak |
| 9,431,290 B2 | 8/2016 | Niimura |
| 9,431,481 B2 | 8/2016 | Lee |
| 9,431,550 B2 | 8/2016 | Chen et al. |
| 9,437,424 B2 | 9/2016 | Pattanayak et al. |
| 9,443,974 B2 | 9/2016 | Gao et al. |
| 9,472,403 B2 | 10/2016 | Carta et al. |
| 9,478,441 B1 | 10/2016 | Sridevan |
| 2001/0005031 A1 | 6/2001 | Sakamoto et al. |
| 2001/0026006 A1 | 10/2001 | Noble et al. |
| 2001/0026989 A1 | 10/2001 | Thapar |
| 2001/0050394 A1 | 12/2001 | Onishi et al. |
| 2001/0052601 A1 | 12/2001 | Onishi et al. |
| 2002/0016034 A1 | 2/2002 | Gonzalez |
| 2002/0030237 A1 | 3/2002 | Omura et al. |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0011046 A1 | 1/2003 | Qu |
| 2003/0030092 A1 | 2/2003 | Darwish et al. |
| 2003/0085422 A1 | 5/2003 | Amali et al. |
| 2003/0193067 A1 | 10/2003 | Kim et al. |
| 2003/0201483 A1 | 10/2003 | Sumida |
| 2004/0016959 A1 | 1/2004 | Yamaguchi et al. |
| 2004/0021173 A1 | 2/2004 | Sapp |
| 2004/0021174 A1 | 2/2004 | Kobayashi |
| 2004/0056284 A1 | 3/2004 | Nagaoka et al. |
| 2004/0113201 A1 | 6/2004 | Bhalla et al. |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2004/0222458 A1 | 11/2004 | Hsieh et al. |
| 2004/0222461 A1 | 11/2004 | Peyre-Lavigne et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0062124 A1 | 3/2005 | Chiola |
| 2005/0079678 A1 | 4/2005 | Verma et al. |
| 2005/0167695 A1 | 8/2005 | Yilmaz |
| 2005/0184336 A1 | 8/2005 | Takahashi et al. |
| 2005/0215011 A1 | 9/2005 | Darwish et al. |
| 2005/0266642 A1 | 12/2005 | Kubo et al. |
| 2006/0014349 A1 | 1/2006 | Williams et al. |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0209887 A1 | 9/2006 | Bhalla et al. |
| 2006/0214221 A1 | 9/2006 | Challa et al. |
| 2006/0214242 A1 | 9/2006 | Carta et al. |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0273390 A1 | 12/2006 | Hshieh et al. |
| 2006/0285368 A1 | 12/2006 | Schlecht |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0040217 A1 | 2/2007 | Saito et al. |
| 2007/0048909 A1 | 3/2007 | Sridevan |
| 2007/0138546 A1 | 6/2007 | Kawamura et al. |
| 2007/0145514 A1* | 6/2007 | Kocon ............... H01L 29/407 257/488 |
| 2007/0155104 A1 | 7/2007 | Marchant et al. |
| 2007/0228496 A1 | 10/2007 | Rochefort et al. |
| 2007/0249142 A1 | 10/2007 | Hisanaga |
| 2007/0272977 A1 | 11/2007 | Saito et al. |
| 2007/0290257 A1 | 12/2007 | Kraft et al. |
| 2008/0042172 A1 | 2/2008 | Hirler et al. |
| 2008/0079078 A1 | 4/2008 | Noguchi et al. |
| 2008/0090347 A1 | 4/2008 | Huang et al. |
| 2008/0099344 A9 | 5/2008 | Basol et al. |
| 2008/0135931 A1 | 6/2008 | Challa et al. |
| 2008/0164515 A1 | 7/2008 | Li |
| 2008/0164517 A1 | 7/2008 | Ohta et al. |
| 2008/0173969 A1 | 7/2008 | Hebert et al. |

(56) References Cited

U.S. PATENT DOCUMENTS

| | | |
|---|---|---|
| 2008/0185640 A1 | 8/2008 | Nakagawa |
| 2008/0185643 A1* | 8/2008 | Hossain ............ H01L 29/0634 257/342 |
| 2008/0197407 A1 | 8/2008 | Challa et al. |
| 2008/0211020 A1 | 9/2008 | Saito |
| 2008/0246081 A1 | 10/2008 | Li et al. |
| 2008/0290403 A1 | 11/2008 | Ono et al. |
| 2009/0020810 A1 | 1/2009 | Marchant |
| 2009/0079002 A1 | 3/2009 | Lee et al. |
| 2009/0085099 A1 | 4/2009 | Su et al. |
| 2009/0090967 A1 | 4/2009 | Chen et al. |
| 2009/0140327 A1 | 6/2009 | Hirao et al. |
| 2009/0159963 A1 | 6/2009 | Yamaguchi et al. |
| 2009/0166721 A1* | 7/2009 | Denison ............. H01L 27/0262 257/328 |
| 2009/0166740 A1 | 7/2009 | Bhalla et al. |
| 2009/0206440 A1 | 8/2009 | Schulze et al. |
| 2009/0315104 A1 | 12/2009 | Hsieh |
| 2010/0006935 A1 | 1/2010 | Huang et al. |
| 2010/0025760 A1 | 2/2010 | Kawashima |
| 2010/0032791 A1 | 2/2010 | Hozumi et al. |
| 2010/0055892 A1 | 3/2010 | Poelzl |
| 2010/0059797 A1 | 3/2010 | Ngai et al. |
| 2010/0078775 A1 | 4/2010 | Mauder et al. |
| 2010/0084704 A1 | 4/2010 | Darwish et al. |
| 2010/0181606 A1 | 7/2010 | Takaishi |
| 2010/0233667 A1 | 9/2010 | Wilson et al. |
| 2010/0289032 A1 | 11/2010 | Zhang et al. |
| 2010/0311216 A1 | 12/2010 | Marchant |
| 2011/0001189 A1 | 1/2011 | Challa et al. |
| 2011/0049614 A1 | 3/2011 | Gao et al. |
| 2011/0053326 A1 | 3/2011 | Gao et al. |
| 2011/0089486 A1 | 4/2011 | Xu et al. |
| 2011/0089488 A1 | 4/2011 | Yilmaz et al. |
| 2011/0233667 A1 | 9/2011 | Tai et al. |
| 2011/0241104 A1 | 10/2011 | Willmeroth et al. |
| 2011/0254084 A1 | 10/2011 | Terrill et al. |
| 2012/0112306 A1* | 5/2012 | Onishi ............... H01L 29/0634 257/487 |
| 2012/0187474 A1 | 7/2012 | Rexer et al. |
| 2012/0187477 A1* | 7/2012 | Hsieh ................ H01L 29/0634 257/331 |
| 2012/0241847 A1 | 9/2012 | Saito et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0273916 A1 | 11/2012 | Yedinak et al. |
| 2012/0299094 A1 | 11/2012 | Lee et al. |
| 2012/0313161 A1 | 12/2012 | Grivna et al. |
| 2012/0326229 A1 | 12/2012 | Poelzl et al. |
| 2013/0069145 A1 | 3/2013 | Kawano et al. |
| 2013/0134500 A1 | 5/2013 | Tamaki et al. |
| 2013/0140633 A1 | 6/2013 | Pattanayak |
| 2013/0187196 A1 | 7/2013 | Kadow |
| 2013/0207227 A1 | 8/2013 | Azam et al. |
| 2013/0214355 A1 | 8/2013 | Fang et al. |
| 2013/0264650 A1 | 10/2013 | Tamaki et al. |
| 2013/0277763 A1 | 10/2013 | Ohta et al. |
| 2013/0292762 A1 | 11/2013 | Blanchard |
| 2013/0320462 A1 | 12/2013 | Tipirneni et al. |
| 2013/0334598 A1 | 12/2013 | Okumura |
| 2014/0027842 A1 | 1/2014 | Tamaki et al. |
| 2014/0027847 A1 | 1/2014 | Tamaki et al. |
| 2014/0035002 A1 | 2/2014 | Cao et al. |
| 2014/0061644 A1 | 3/2014 | Cao et al. |
| 2014/0061783 A1 | 3/2014 | Xiao |
| 2014/0110779 A1 | 4/2014 | Tamaki |
| 2014/0117445 A1 | 5/2014 | Kimura et al. |
| 2014/0159143 A1 | 6/2014 | Ma et al. |
| 2014/0191309 A1 | 7/2014 | Eguchi et al. |
| 2014/0191310 A1 | 7/2014 | Ono et al. |
| 2014/0199816 A1 | 7/2014 | Lin et al. |
| 2014/0206162 A1 | 7/2014 | Eguchi et al. |
| 2014/0206165 A1 | 7/2014 | Li et al. |
| 2014/0242769 A1 | 8/2014 | Yamada et al. |
| 2014/0284704 A1 | 9/2014 | Saito et al. |
| 2014/0291773 A1 | 10/2014 | Lin et al. |
| 2014/0299961 A1 | 10/2014 | Tamaki et al. |
| 2014/0302621 A1 | 10/2014 | Niimura |
| 2014/0312418 A1 | 10/2014 | Tamaki et al. |
| 2014/0327039 A1 | 11/2014 | Lin et al. |
| 2014/0370674 A1 | 12/2014 | Toyoda et al. |
| 2015/0054062 A1 | 2/2015 | Lin et al. |
| 2015/0054119 A1 | 2/2015 | Tan et al. |
| 2015/0076599 A1 | 3/2015 | Cho et al. |
| 2015/0097237 A1 | 4/2015 | Tamaki et al. |
| 2015/0108568 A1 | 4/2015 | Terrill et al. |
| 2015/0115286 A1 | 4/2015 | Takeuchi et al. |
| 2015/0115355 A1 | 4/2015 | Hirler et al. |
| 2015/0115358 A1 | 4/2015 | Mauder et al. |
| 2015/0116031 A1 | 4/2015 | Wahl et al. |
| 2015/0137697 A1 | 5/2015 | Cheng |
| 2015/0155378 A1 | 6/2015 | Tamaki et al. |
| 2015/0179764 A1 | 6/2015 | Okumura |
| 2015/0187913 A1 | 7/2015 | Peake et al. |
| 2015/0249124 A1 | 9/2015 | Ma et al. |
| 2015/0270157 A1 | 9/2015 | Niimura |
| 2015/0287778 A1 | 10/2015 | Tamaki et al. |
| 2015/0340231 A1 | 11/2015 | Toyoda et al. |
| 2015/0364577 A1 | 12/2015 | Nishimura et al. |
| 2015/0372078 A1 | 12/2015 | Pattanayak et al. |
| 2015/0372132 A1 | 12/2015 | Pattanayak et al. |
| 2016/0020273 A1 | 1/2016 | Woo et al. |
| 2016/0020276 A1 | 1/2016 | Lu |
| 2016/0020315 A1 | 1/2016 | Hirler |
| 2016/0035880 A1 | 2/2016 | Tamaki |
| 2016/0049466 A1 | 2/2016 | Abiko et al. |
| 2016/0079079 A1 | 3/2016 | Eguchi et al. |
| 2016/0079411 A1 | 3/2016 | Hino et al. |
| 2016/0126345 A1 | 5/2016 | Tamaki et al. |
| 2016/0133505 A1 | 5/2016 | Eguchi et al. |
| 2016/0190235 A1 | 6/2016 | Tamaki et al. |
| 2016/0225893 A1 | 8/2016 | Hirler et al. |

FOREIGN PATENT DOCUMENTS

| | | |
|---|---|---|
| DE | 3932621 | 4/1990 |
| DE | 4208695 | 9/1992 |
| DE | 102004036330 | 3/2005 |
| DE | 10343084 | 5/2005 |
| DE | 102004057792 | 6/2006 |
| DE | 112005003584 | 4/2008 |
| DE | 112006003618 | 11/2008 |
| DE | 102008032711 | 1/2009 |
| DE | 102009036930 | 3/2010 |
| EP | 0133642 | 3/1985 |
| EP | 0227894 | 7/1987 |
| EP | 0279403 | 8/1988 |
| EP | 0310047 | 4/1989 |
| EP | 0345380 | 12/1989 |
| EP | 0354449 | 2/1990 |
| EP | 0438700 | 7/1991 |
| EP | 0580213 | 1/1994 |
| EP | 0583022 | 2/1994 |
| EP | 0583023 | 2/1994 |
| EP | 0620588 | 10/1994 |
| EP | 0628337 | 12/1994 |
| EP | 0746030 | 12/1996 |
| EP | 1033759 | 9/2000 |
| EP | 1186023 | 3/2002 |
| EP | 1351313 | 10/2003 |
| EP | 1376674 | 1/2004 |
| EP | 1403914 | 3/2004 |
| FR | 2647596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| GB | 2269050 | 1/1994 |
| JP | 5658267 | 5/1981 |
| JP | 5984474 | 5/1984 |
| JP | 59141267 | 8/1984 |
| JP | 60249367 | 12/1985 |

(56) References Cited

FOREIGN PATENT DOCUMENTS

| | | |
|---|---|---|
| JP | 6180860 | 4/1986 |
| JP | 62176168 | 8/1987 |
| JP | 62298152 | 12/1987 |
| JP | 142177 | 2/1989 |
| JP | 1198076 | 8/1989 |
| JP | 1310576 | 12/1989 |
| JP | 291976 | 3/1990 |
| JP | H02114646 | 4/1990 |
| JP | H03173180 | 7/1991 |
| JP | H05315620 | 11/1993 |
| JP | H06350090 | 12/1994 |
| JP | H09129877 | 5/1997 |
| JP | H09260645 | 10/1997 |
| JP | H10032331 | 2/1998 |
| JP | H10214809 | 8/1998 |
| JP | 2000091344 | 3/2000 |
| JP | 2000332246 | 11/2000 |
| JP | 2001016080 | 1/2002 |
| JP | 3273180 | 4/2002 |
| JP | 2002110978 | 4/2002 |
| JP | 2002127830 | 5/2002 |
| JP | 2002134705 | 5/2002 |
| JP | 2002190593 | 7/2002 |
| JP | 2002222950 | 8/2002 |
| JP | 2002246596 | 8/2002 |
| JP | 2002540603 | 11/2002 |
| JP | 2002368221 | 12/2002 |
| JP | 2002373988 | 12/2002 |
| JP | 2003030396 | 1/2003 |
| JP | 2003101039 | 4/2003 |
| JP | 2003515954 | 5/2003 |
| JP | 2003179223 | 6/2003 |
| JP | 2003324196 | 11/2003 |
| JP | 2004134793 | 4/2004 |
| JP | 2004522319 | 7/2004 |
| JP | 2005142240 | 6/2005 |
| JP | 2005209983 | 8/2005 |
| JP | 2005524970 | 8/2005 |
| JP | 2005268679 | 9/2005 |
| JP | 2005286328 | 10/2005 |
| JP | 2006005275 | 1/2006 |
| JP | 2006128507 | 5/2006 |
| JP | 2006310782 | 11/2006 |
| JP | 2006339558 | 12/2006 |
| JP | 2006344779 | 12/2006 |
| JP | 2007027561 | 2/2007 |
| JP | 2007042836 | 2/2007 |
| JP | 2007157799 | 6/2007 |
| JP | 2007158275 | 6/2007 |
| JP | 2007173783 | 7/2007 |
| JP | 2007189192 | 7/2007 |
| JP | 2007529115 | 10/2007 |
| JP | 2008042056 | 2/2008 |
| JP | 2008511982 | 4/2008 |
| JP | 2008171887 | 7/2008 |
| JP | 2008294214 | 12/2008 |
| JP | 2009004411 | 1/2009 |
| JP | 2009043966 | 2/2009 |
| JP | 2009117715 | 5/2009 |
| JP | 2009522807 | 6/2009 |
| JP | 2010147065 | 7/2010 |
| JP | 2010251404 | 11/2010 |
| JP | 2011003729 | 1/2011 |
| JP | 2011192824 | 9/2011 |
| JP | 2011199223 | 10/2011 |
| JP | 2011204710 | 10/2011 |
| JP | 2012104577 | 5/2012 |
| KR | 1020120027299 | 3/2012 |
| KR | 101315699 | 10/2013 |
| TW | 490853 | 6/2002 |
| TW | 302028 | 10/2008 |
| WO | 0065646 | 11/2000 |
| WO | 0141206 | 6/2001 |
| WO | 0199177 | 12/2001 |
| WO | 03010812 | 2/2003 |
| WO | 2004105116 | 2/2004 |
| WO | WO2005065385 | 7/2005 |
| WO | 2006058210 | 1/2006 |
| WO | 2006025035 | 3/2006 |
| WO | WO2006027739 | 3/2006 |
| WO | 2006126998 | 11/2006 |
| WO | 2007002857 | 1/2007 |
| WO | WO2007002857 | 1/2007 |
| WO | 2008156071 | 12/2008 |
| WO | WO2010132144 | 11/2010 |
| WO | 2011031563 | 3/2011 |
| WO | 2012149195 | 11/2012 |

OTHER PUBLICATIONS

A. Q. Huang, "New Unipolar Switching Power Device Figures of Merit," IEEE Electron Device Letters, vol. 25, No. 5, May 2004, pp. 298-301.

Antognetti, "Power Integrated Circuits: Physics, Design, and Applications," McGraw-Hill Book Co., 1986, pp. 3.14-3.27, Dec.

Antoniu et al., "Towards Achieving the Soft-Punch-Through Superjunction Insulated-Gate Bipolar Transistor Breakdown Capability," IEEE Electron Device Letters, vol. 32, No. 9, Sep. 2011, pp. 1275-1277.

Baliga, "Modern Power Devices", A Wiley-Interscience Publication, John Wiley & Sons, Inc., 1987, pp. 62-131.

Barbuscia et al., "Modeling of Polysilicon Dopant Diffusion for Shallow-Junction Bipolar Technology", IEDM, 1984, pp. 157-760, No Month.

Chang et al., "Vertical FET Random-Access Memories With Deep Trench Isolation," IBM Technical Disclosure Bulletin, vol. 22, No. 8B, Jan. 1980, pp. 3683-3687.

D. Jaume et al, "High-Voltage Planar Devices Using Field Plate and Semi-Resistive Layers", IEEE Trans. on Electron Devices, vol. 38, No. 7, Jul. 1991, pp. 1681-1684.

Deboy et al., "A new generation of high voltage MOSFETs breaks the limit line of silicon," IEDM '98, Technical Digest, International, Dec. 1998, pp. 683-685, IEEE.

Iwamoto et al., "Above 500V class Superjunction MOSFETs fabricated by deep trench etching and epitaxial growth," Proceedings of the 17th International Symposium on Power Semiconductor Devices & ICs, May 23-26, 2005, pp. 31-34, IEEE.

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797.

Kim et al., "New Power Device Figure of Merit for High-Frequency Applications," Proceedings of 1995 International Symposium on Power Semiconductor Devices & ICs, pp. 309-314.

Lorenz et al., "COOLMOS(TM)—a new milestone in high voltage Power MOS," Proceedings of the 11th International Symposium on Power Semiconductor Devices & ICs, 1999, pp. 3-10, IEEE.

P. Ou-Yang, "Double Ion Implanted V-MOS Technology", IEEE Journal of Solid State Circuits, vol. SC-12, No. 1, Feb. 1977, pp. 3-10.

Patent Application As Filed for U.S. Appl. No. 14/663,872; Inventors: Misbah Ul Azam et al.; filed Mar. 20, 2015; "MOSFET Termination Trench,".

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367.

Saito et al., "A 20 m.Omega. . . cndot. cm2 600V-class Superjunction MOSFET," Proceedings of 2004 International Symposium on Power Semiconductor Devices & ICs, pp. 459-462.

Shenoy et al., "Analysis of the Effect of Charge Imbalance on the Static and Dynamic Characteristics of the Superjunction MOSFET," Proceedings of the 11th International Symposium on Power Semiconductor Devices & ICs, 1999, pp. 99-102, IEEE.

Takemura et al., "BSA Technology for Sub-100nm Deep Base Bipolar Transistors", Int'l Elec. Devs. Meeting, 1987, pp. 375-378. Jan.

"Effects on Selecting Channel Direction in Improving Performance of Sub-100 nm MOSFETs Fabricated on (110) Surface Si Substrate"

(56) References Cited

OTHER PUBLICATIONS

Japanese Journal of Applied Physics, Part 1, vol. 43, No. 4B, Apr. 2004 pp. 1723-1728 (Nakamura et al.), XP00122768.

Hattori, et al.; Design of a 200V Super Junction MOSFET with N-Buffer Regions and its Fabrication by Trench Filling; Proceedings of 2004 International Symposium on Power Semiconductor Devices & ICS, Kitakyushu; 2004.

Kaeiko, et al. Semiconductor Device, English Abstract for JP 2007-189192, Published Jul. 26, 2007, Patent Abstracts of Japan, http://www19.ipdl.inpit.go.jp/PA1/cgi-bin/PA1DETAIL.

L. Parechanian-Allen et al., "Device Quality Growth and Characterization of (110) GaAs Grown by Molecular Beam Epitaxy", submitted to Applied Physics Letters, Nov. 1986, Lawrence Berkeley Laboratory University of California, Berkeley, California, LBL-22564.

L. Parechanian-Allen et al., "Surface Faceting of (110) GaAs: Analysis and Elimination", presented at the Material Research Society Fall Conference, Session I, Boston, MA, Dec. 1, 1986, Lawrence Berkeley Laboratory Jniversity of California, Berkeley, California, LBL-22577.

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

Session I, Boston, MA, Dec. 1, 1986, Lawrence Berkeley Laboratory Jniversity of California, Berkeley, California, LBL-22577.

Y. C. Pao et al., "(110)-Oriented GaAs MESFET's", IEEE Electron Device Letters, vol. 9, No. 3, pp. 119-121, Mar. 1988.

\* cited by examiner

EDGE TERMINATION FOR SUPER-JUNCTION MOSFETS

RELATED APPLICATION

This Application claims priority to U.S. Provisional Patent Application No. 62/039,346, filed Aug. 19, 2014, entitled, "New Edge Termination for SJMOSFETs with Plates" to Pattanayak, which is hereby incorporated herein by reference in its entirety.

FIELD OF INVENTION

Embodiments of the present invention relate to the field of integrated circuit design and manufacture. More specifically, embodiments of the present invention relate to systems and methods for a termination of super-junction MOSFETs.

BACKGROUND

Super-junction metal oxide semiconductor field effect transistors (MOSFETs) comprise a drift region made up of both N-type and P-type regions. Super-junction MOSFETs critically depend on maintaining a definite charge relation between the N and P regions in the drift regions. In general, plate type structures in a drift region show less manufacturing variation in volume, and hence less variation in total charge, in comparison to pillar type structures, e.g., with a round or oval cross section. Accordingly, devices comprising plate type structures in a drift region generally present improved control of a desired charge relation, in comparison to pillar type structures. For this reason, plate type structures may be preferred over pillar type structures for a drift region of a super-junction MOSFET.

However, plate type regions have a directional asymmetry in the sense that in one direction the plates are floating, and in the other, perpendicular, dimension they assume source potential at very low currents. This characteristic requires development of a termination scheme within the constraints of charge balance requirements.

SUMMARY OF THE INVENTION

Therefore, what is needed are systems and methods for edge termination for super-junction MOSFETs. An additional need exists for edge termination for super-junction MOSFETs with increased breakdown voltage in a decreased distance. What is further needed are systems and methods for edge termination for super-junction MOSFETs comprising plate structures in the drift region. A still further need exists for systems and methods for edge termination for super-junction MOSFETs that are compatible and complementary with existing systems and methods of integrated circuit design, manufacturing and test. Embodiments of the present invention provide these advantages.

In accordance with an embodiment of the present invention, a super-junction metal oxide semiconductor field effect transistor (MOSFET) includes a core super-junction region including a plurality of parallel core plates coupled to a source terminal of the super-junction MOSFET. The super-junction MOSFET also includes a termination region surrounding the core super-junction region comprising a plurality of separated floating termination segments configured to force breakdown into the core super-junction region and not in the termination region. Each termination segment has a length dimension less than a length dimension of the core plates.

In accordance with another embodiment of the present invention, a metal oxide semiconductor field effect transistor (MOSFET) includes a core region formed in a substrate of first conductivity, below an active region of the MOSFET. The core region includes a plurality of parallel core plates of a second conductivity coupled to a source terminal of the MOSFET, each of the plates having a plate width. The core plates alternate with regions of the first conductivity having a width of about the plate width. The MOSFET also includes a termination region surrounding the core region. The termination region includes a plurality of separated floating termination segments of the second conductivity formed in the substrate, separated from one another by regions of the first conductivity. Each of the termination segments has a length dimension less than a length dimension of the core plates. The termination region is configured to have a higher breakdown voltage than the core region.

In accordance with yet another embodiment of the present invention, a vertical trench MOSFET includes a substrate of first conductivity, and a plurality of gate trenches descending beneath a surface of the substrate. Each gate trench includes one or more gates of the MOSFET. For example, a trench may comprise an active gate and optionally a shield gate, which may be coupled to the source. The vertical trench MOSFET also includes source and body regions of the MOSFET in a mesa between the gate trenches and a drift region below the gate trenches and below the source and body regions. The drift region includes a plurality of core plates of a second conductivity alternating with regions of the first conductivity, wherein the core plates are coupled to the source regions of the MOSFET. The vertical trench MOSFET further includes a termination region surrounding the drift region at about the same depth as the drift region. The termination region includes a plurality of separated floating termination segments of the second conductivity formed in the substrate, separated from one another by regions of the first conductivity. There are no gates of the MOSFET above the termination region, and each of the termination segments has a length dimension not greater than a length dimension of the core plates.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1:
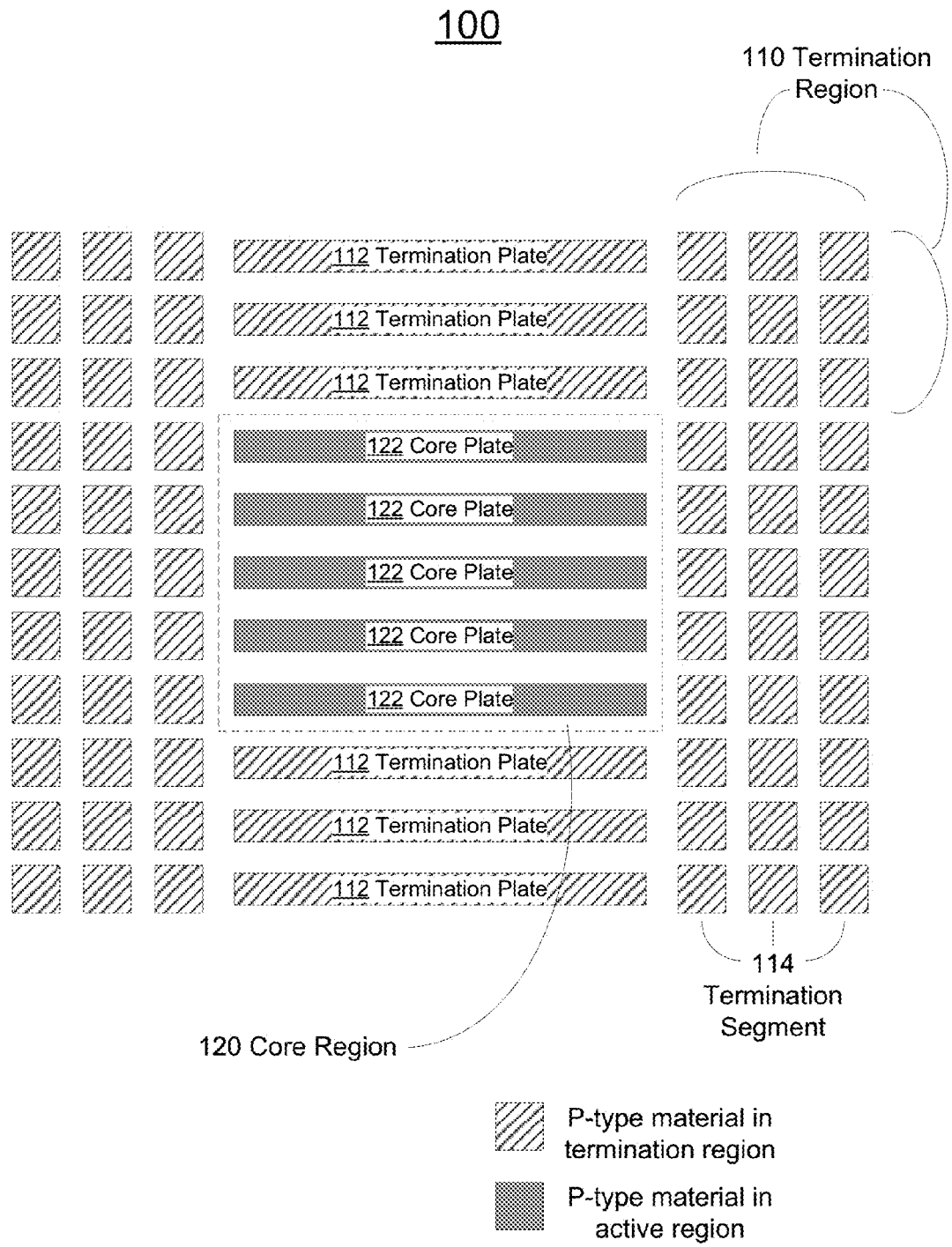
FIG. 1 illustrates a plan view of an exemplary edge termination for a super-junction MOSFET, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation And Nomenclature

The figures are not drawn to scale, and only portions of the structures, as well as the various layers that form those structures, may be shown in the figures. Furthermore, fabrication processes and operations may be performed along with the processes and operations discussed herein; that is, there may be a number of process operations before, in between and/or after the operations shown and described herein. Importantly, embodiments in accordance with the present invention can be implemented in conjunction with these other (perhaps conventional) processes and operations without significantly perturbing them. Generally speaking, embodiments in accordance with the present invention may replace and/or supplement portions of a conventional process without significantly affecting peripheral processes and operations.

As used herein, the letter "n" refers to an n-type dopant and the letter "p" refers to a p-type dopant. A plus sign "+" or a minus sign "−" is used to represent, respectively, a relatively high or relatively low concentration of such dopant(s).

The term "channel" is used herein in the accepted manner. That is, current moves within a FET in a channel, from the source connection to the drain connection. A channel can be made of either n-type or p-type semiconductor material; accordingly, a FET is specified as either an re-channel or p-channel device. Some of the figures are discussed in the context of an n-channel device, more specifically an n-channel vertical MOSFET; however, embodiments according to the present invention are not so limited. That is, the features described herein may be utilized in a p-channel device. The discussion of an n-channel device can be readily mapped to a p-channel device by substituting p-type dopant and materials for corresponding n-type dopant and materials, and vice versa. In addition, embodiments in accordance with the present invention are well suited to planar gate super-junction MOSFETs.

The term "trench" has acquired two different, but related meanings within the semiconductor arts. Generally, when referring to a process, e.g., etching, the term trench is used to mean or refer to a void of material, e.g., a hole or ditch. Generally, the length of such a hole is much greater than its width or depth. However, when referring to a semiconductor structure or device, the term trench is used to mean or refer to a solid vertically-aligned structure, disposed beneath a surface of a substrate, having a complex composition, different from that of the substrate, and usually adjacent to a channel of a field effect transistor (FET). The structure comprises, for example, a gate of the FET. Accordingly, a trench semiconductor device generally comprises a mesa structure, which is not a trench, and portions, e.g., one half, of two adjacent structural "trenches."

It is to be appreciated that although the semiconductor structure commonly referred to as a "trench" may be formed by etching a trench and then filling the trench, the use of the structural term herein in regards to embodiments of the present invention does not imply, and is not limited to such processes.

Edge Termination for Super-Junction Mosfets

One function of an edge termination in a super-junction MOSFET is to drop the potential gradually from that of the source potential to the drain potential in a manner that does not stress the source metal above the ionizing potential of air. The source to drain potential may be on the order of 600 volts or more.

FIG. 1 illustrates a plan view of an exemplary edge termination 110 for a super-junction MOSFET 100, in accordance with embodiments of the present invention. The closed shapes of FIG. 1 indicate p-type material, for example, p-type material in an n-type epitaxial layer. It is appreciated that the area around and between p-type regions is typically n-type material. The termination region 110 comprises a plurality of termination segments 114 and termination plates 112 surrounding a core region 120. The p-type termination plates 112 and termination segments 114 are floating. There be more or fewer than the exemplary three rows of termination plates 112 and termination segments 114, in some embodiments.

The core region 120 is typically beneath active devices, e.g., MOSFETs, and is generally much larger in area than termination region 110. The p-type core plates 122 in the core region 120 are typically coupled to the source electrode, e.g., they are at source potential. For example, there will typically be many more core plates 122 than illustrated. The core plates 122, termination plates 112 and termination segments 114 have about the same vertical depth and vertical extent, e.g., in the plane perpendicular to the plane of FIG. 1.

The termination segments 114 are preferably square, e.g., their width is equal to their length, although that is not required. The termination plates 112 should be rectangular, e.g., their length is greater than their width. In general, the termination plates 112 should be the same length as, and aligned in parallel with, the p-plates 122 within the core region 120. The width of the segments 114 and the plates 112 are not necessarily the same.

The number of termination plates 112 and termination segments 114 and their spacing is determined by the desired source to drain potential of the super-junction MOSFET. In silicon, approximately 10 volts can be supported in a space of 1 μm. For a 600 volt device, the total space consumed by the gaps between the p-type structures (n-type material between termination plates 112 and/or termination segments 114) from one another should be of the order of 40 μm, e.g., supporting approximately 400 volts. It is appreciated that the spacing need not be regular. Assuming the width of the p-type structures to be 5 μm each, supporting about 50 volts, eight such segments are required to support 400 volts. Together therefore, for an 800 volt edge termination of the type described, the edge termination width can be as low as 80 μm. According to the conventional art, a commercially available product requires about 230 μm for about 600 volts of edge termination.

In accordance with embodiments of the present invention, the termination plates 112 and termination segments 114 and the inter-segment spacing should be designed in such a way that the charge balance condition is set so that all the segments are mostly depleted and the breakdown voltage of the edge termination is slightly higher than that of the core region. This will improve unclamped inductive-switching (UIS) capability of the device.

It is not necessary, however, that the edge segments be completely depleted. The depletion layers of the segments should merge with each other and support the voltage in both horizontal and vertical dimensions (in the view of FIG. 1). The segments surrounding the core area may be designed differently than the core plates so that the breakdown voltage of the edge is slightly higher than that of the core, for example, forcing breakdown into the core region and not in the termination region.

In accordance with embodiments of the present invention, segment spacing and width may be designed according to Relation 1, below:

$$\delta Q_n \sim 2\delta Q_p \quad \text{(Relation 1)}$$

where $\delta Q_n$ is the charge in the space between the termination segments, and $\delta Q_p$ is the additional charge in the P plate segment, due do its greater width relative to the width of the core plate.

In accordance with embodiments of the present invention, a super-junction MOSFET may advantageously have a charge imbalance, e.g., the charge of p-type material is not equal to the charge of n-type material, in the termination region. For example, $Q_p \neq Q_n$. In accordance with embodiments of the present invention, for an n-channel MOSFET formed in n-type material, e.g., an n-type epitaxial layer, the charge of n-type material may be slightly larger than the charge of p-type material, e.g., $Q_p < Q_n$. The termination breakdown voltage should be higher than the core breakdown voltage, with different charge imbalance between these two regions.

Figure 2:
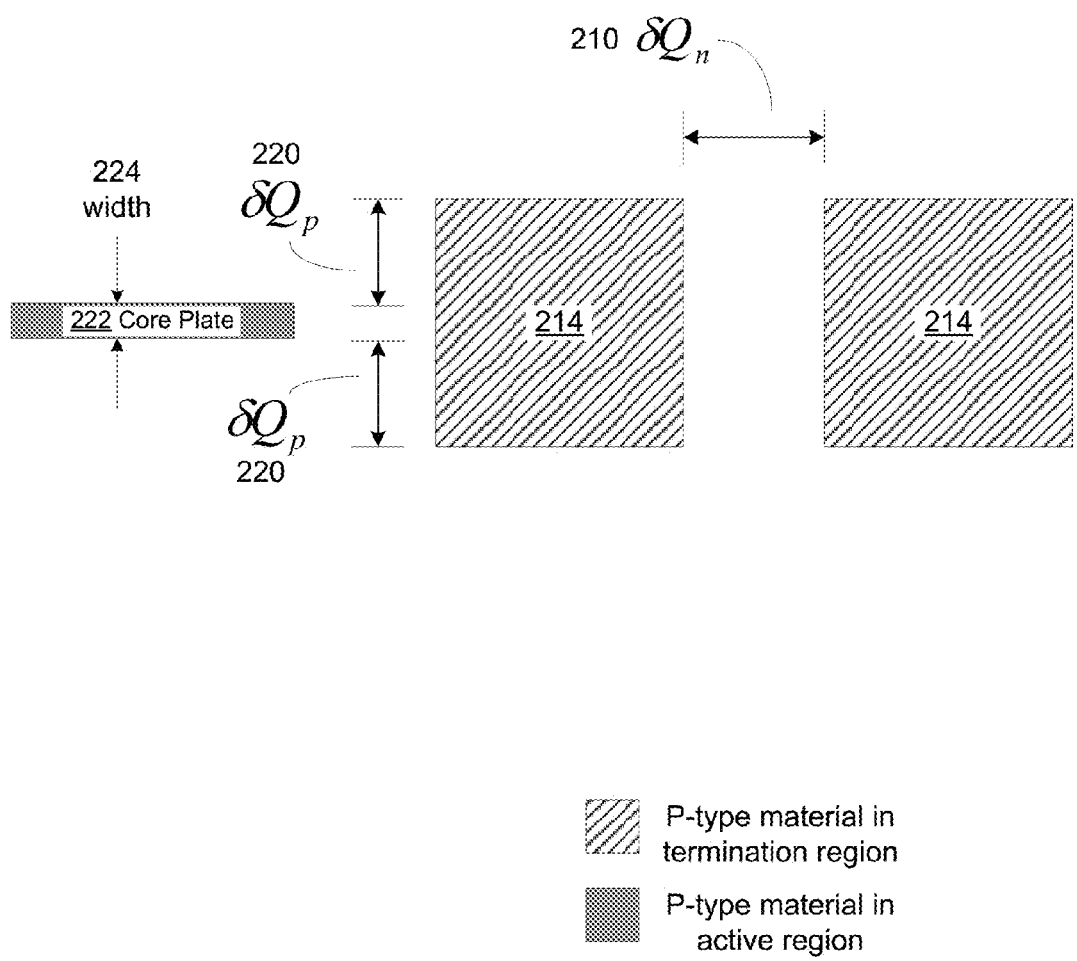
FIG. 2 illustrates an exemplary design of termination segments, in accordance with embodiments of the present invention.

FIG. 2 illustrates an exemplary design 200 of termination segments, e.g., corresponding to termination segments 114 of FIG. 1, in accordance with embodiments of the present invention. FIG. 2 is not drawn to scale. FIG. 2 illustrates a portion 222 of a core plate, e.g., corresponding to core plate 122 of FIG. 1. Core plate portion 222 has a width dimension 224. It is appreciated that the full horizontal length of core plate portion 222 may not be illustrated.

FIG. 2 also illustrates a plurality of termination segments 214, e.g., corresponding to termination segments 114 of FIG. 1. The termination segments 214 are wider than core plate 222. The increased width provides an increased charge of $2\delta Q_p$ (220) in comparison to a termination segment of the same width (224) as the core plate. The termination segments 214 are spaced at a distance from each other 210 that provides a charge of $\delta Q_n$ (210). Thus, the conditions of Relation 1 are met.

It is appreciated that dimensions 210 and 220 are illustrated in terms of the charge available in such regions. The actual physical dimensions are a function of the dopant densities of both n-type and p-type materials and the width of the core plate 222. As previously presented, the number of termination segments 214 and their spacing 210 are functions of the desired breakdown voltage in the termination region.

In this novel manner, the charge balance condition is set so that all the termination segments 214 are mostly depleted and the breakdown voltage of the edge termination is slightly higher than that of the core region, thus improving the unclamped inductive-switching (UIS) capability of the device.

Figure 3:
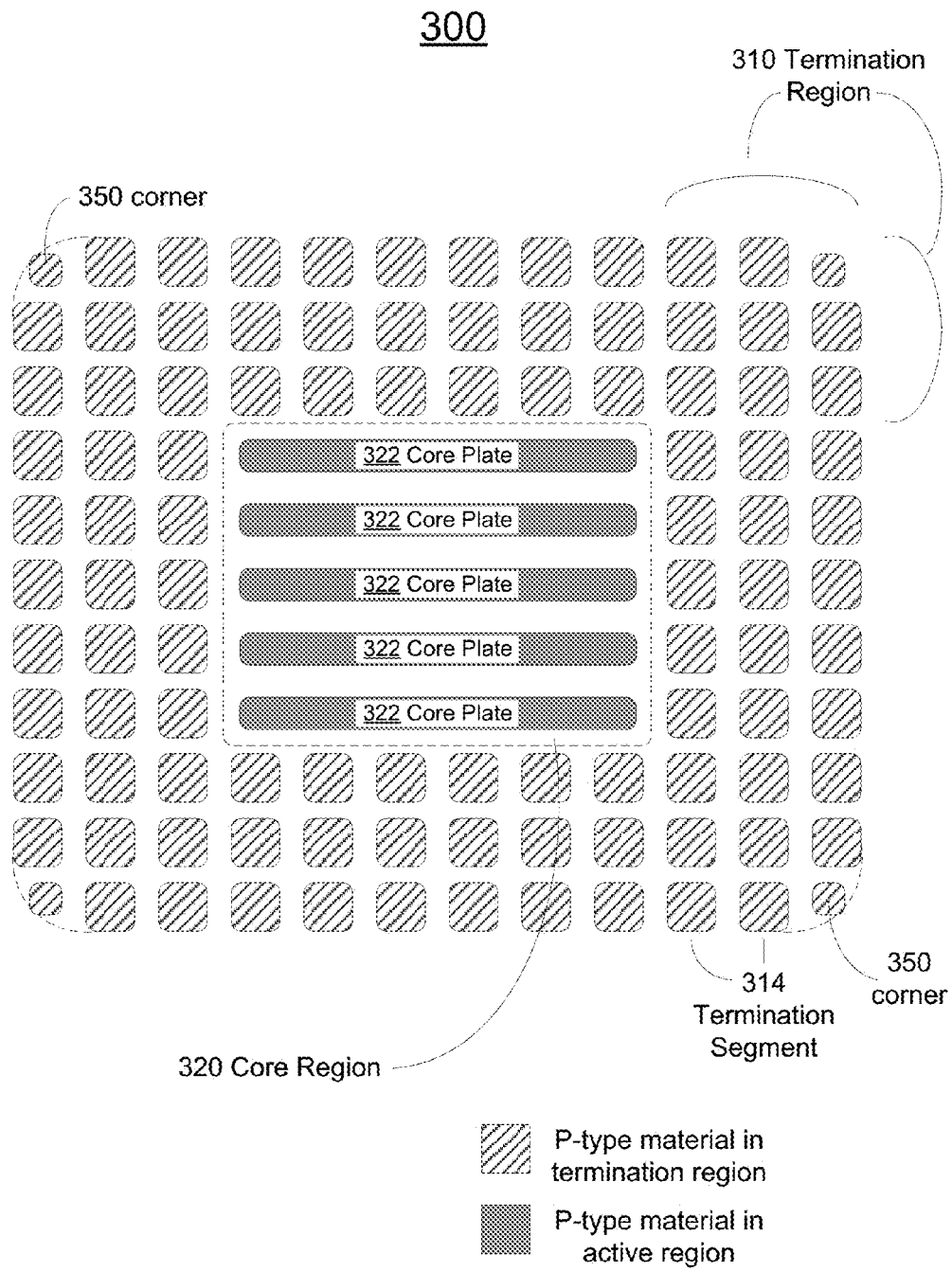
FIG. 3 illustrates a plan view of an exemplary edge termination for a super-junction MOSFET, in accordance with embodiments of the present invention.

FIG. 3 illustrates a plan view of an exemplary edge termination 310 for a super-junction MOSFET 300, in accordance with embodiments of the present invention. The closed shapes of FIG. 3 indicate p-type material, for example, p-type material in an n-type epitaxial layer. It is appreciated that the area around and between p-type regions is typically n-type material. In contrast to FIG. 1, the terminal region 310 comprises all segment regions, for example, there are no plate regions in the termination region. The termination region 310 comprises a plurality of termination segments 314 surrounding a core region 320. The p-type termination segments 314 are floating. There may be more or fewer than the exemplary three rows of termination segments 314, in some embodiments.

The core region 320 is typically beneath active devices, e.g., MOSFETs, and is generally much larger in area than termination region 310. The p-type core plates 322 in the core region 120 are typically coupled to the source electrode, e.g., they are at source potential. For example, there will typically be many more core plates 322 than illustrated.

The termination segments 314 are preferably square, e.g., their width is equal to their length, although that is not required. The width of the termination segments 314 and the core plates 322 are not necessarily the same. The corners of termination segments 314 and/or the core plates 322 may be rounded, as illustrated, to increase breakdown voltage. It is to be appreciated that such rounding is not so extreme as to reduce the segment shapes to that of pillars. For example, the radius of the rounded corners should be much less than one-half of the diagonal distance across the segment. In addition, the corner termination segments, e.g., corner termination segments 350, may be designed differently than the edge cells as demanded by electrostatic considerations relating charge to field distribution, in some embodiments. For example, corner termination segments 350 may be scaled such that the array of termination segments 314 comprises rounded "corners," as indicated by the dotted lines in the corners of the termination region 310.

The number of termination plates 312, their width and their spacing are determined by the desired source to drain potential of the super-junction MOSFET, as previously presented with respect to FIGS. 1 and 2.

In this novel manner, a plurality of separated floating termination segments are configured to force breakdown into the core super-junction region and away from the termination region. Accordingly, the core super-junction region will break down before the termination region, thereby providing an effective termination for the desired drain-source voltage.

Figure 4:
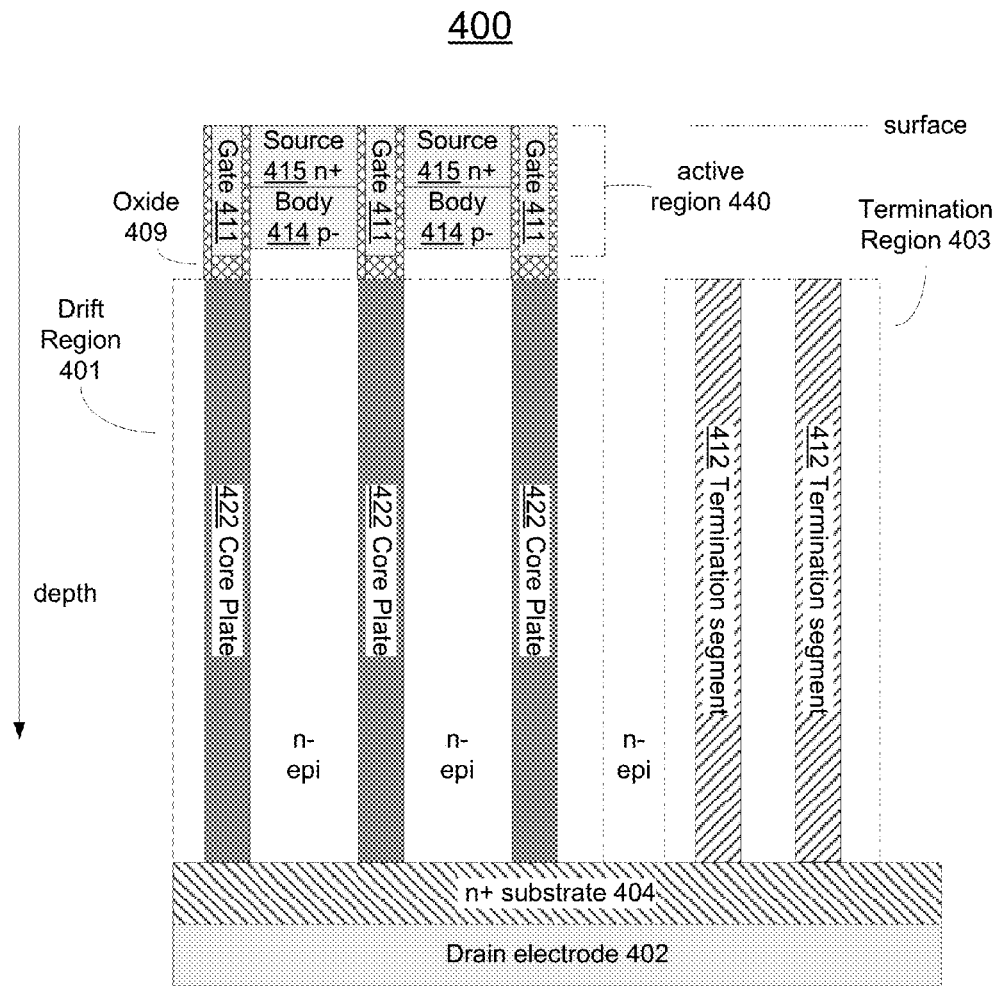
FIG. 4 is an exemplary cross-sectional view showing elements of a semiconductor device, according to an embodiment of the present invention.

FIG. 4 is an exemplary cross-sectional view showing elements of a semiconductor device 400 (e.g., an n-channel Super Junction trench power MOSFET device) according to an embodiment of the present invention. FIG. 4 is an exemplary cross sectional view of the semiconductor device illustrated in FIG. 1 or FIG. 3. The semiconductor device 400 comprises a drain electrode 402 on the bottom surface of an n+ drain layer or substrate 404. FIG. 4 illustrates a drift region 401, below the gates 411 and bodies 414 of device 400. Drift region 401 may also be known as or referred to as a core region. Alternating p− drift regions or p− type columns or plates 422 and n− drift regions or n-type columns are located above the substrate 404, e.g., in epitaxial n− material. The alternating p-type (p−) columns 422 and n-type (n−) columns form what is known as or referred to as a super junction.

In the example embodiment of FIG. 4, each p-type column 422 is located under a respective polysilicon (poly) trench gate 411 (gate poly 411). Generally speaking, each trench gate 411 is aligned above a corresponding p-type column 422. More specifically, each trench gate 411 may be aligned along the longitudinal axis of a corresponding p-type column 422 (given the orientation of FIG. 4, the longitudinal axis is a vertical line within a p-type column)—in one embodiment, the longitudinal axis of a trench gate 411 coincides with the longitudinal axis of a p-type column 422 such that the trench gate 411 is centered over the p-type column 422. In the FIG. 4 embodiment, the p-type columns 422 are separated from the trench gates 411 by a respective isolation layer, e.g., oxide 409.

A p– region (p-type body region 414) is situated in a mesa between the trench gates 411. Also, n+ regions (n-type source regions 415) are situated on opposite sides of each trench gate 411, above the p-type body regions 414. According to an embodiment of the invention, the p-type columns 422 are picked up and electrically shorted to the source metal layer in a well known manner, e.g., outside the plane of FIG. 4 (not shown).

FIG. 4 also illustrates termination segments 412. Termination segments 412 are located in a termination region 403, distinct from, e.g., "outside of," the drift region 401 of semiconductor device 400. For example, there are no gates, e.g., FET gates 411, or FET bodies 414, above the termination region 403, in contrast to the presence of FET gates 411 and FET bodies 414 above the drift region 401. Termination segments are "floating," e.g., not connected to any other terminals, in some embodiments. Termination region 403 is at about the same depth into the semiconductor device 400 as drift region 401, e.g., at a depth deeper than the gate 411 and body 414.

FIG. 4 further illustrates an active region 440 of semiconductor device 400, in accordance with embodiments of the present invention. Active region 440 generally comprises a source, e.g., source 415, a body or channel region, e.g., body 414, and/or a gate, e.g., gate 414.

Embodiments in accordance with the present invention provide systems and methods for trench metal-oxide-semiconductor field-effect transistors (MOSFETs) with self-aligned body contacts. In addition, embodiments in accordance with the present invention provide systems and methods for trench MOSFETs with self-aligned body contacts having increased separation between a body contact implant and a gate trench. Further, embodiments in accordance with the present invention provide systems and methods for trench MOSFETs with self-aligned body contacts having improved performance at finer, e.g., smaller, intergate pitch dimensions. Still further, embodiments in accordance with the present invention provide systems and methods for trench MOSFETs with self-aligned body contacts that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A vertical trench MOSFET comprising:
   a substrate of first conductivity;
   a plurality of gate trenches descending beneath a surface of said substrate,
   wherein each gate trench comprises one or more gates of said MOSFET;
   source and body regions of said MOSFET in a mesa between said gate trenches;
   a drift region below said gate trenches and below said source and body regions, said drift region comprising:
   a plurality of core plates of a second conductivity alternating with regions of said first conductivity, wherein said core plates are coupled to said source regions of said MOSFET;
   a termination region surrounding said drift region at about the same depth as said drift region, said termination region comprising:
   a plurality of separated floating termination segments of said second conductivity formed in said substrate, separated from one another by regions of said first conductivity,
   wherein there are no gates of said MOSFET above said termination region, and
   wherein each of said termination segments has a length dimension not greater than a length dimension of said core plates.

2. The MOSFET of claim 1 wherein said termination segments are wider than said core plates.

3. The MOSFET of claim 1 wherein a charge of one said termination segments is about equal to the magnitude of a charge in a region separating said termination segment from an adjacent termination segment.

4. The MOSFET of claim 1 wherein a charge of said first conductivity is greater than a charge of said second conductivity in said termination region.

5. The MOSFET of claim 1 wherein said termination segments have rounded corners of radius much less than their diagonal dimension.

6. The MOSFET of claim 1 wherein termination segments at a corner of said termination region are reduced in extent to approximate a rounded corner of said termination region.

* * * * *